United States Patent [19]
Mo

[11] Patent Number: 5,519,352
[45] Date of Patent: May 21, 1996

[54] INTEGRATOR SYSTEM WITH VARIABLE GAIN FEEDBACK

[75] Inventor: Zhong H. Mo, Daly City, Calif.

[73] Assignee: TelCom Semiconductor, Inc., Mountain View, Calif.

[21] Appl. No.: 316,283

[22] Filed: Sep. 30, 1994

[51] Int. Cl.⁶ ........................................................ H03M 1/52
[52] U.S. Cl. ............................ 327/345; 327/184; 327/336; 341/167
[58] Field of Search ........................... 327/345, 337, 327/554, 339, 344, 363, 561, 184, 164, 167, 179, 63, 64, 65, 67, 72; 330/254; 341/128, 167, 172

[56] References Cited

U.S. PATENT DOCUMENTS

| | | |
|---|---|---|
| 3,764,831 | 10/1973 | Zwitter et al. .................... 327/336 |
| 4,016,496 | 4/1977 | Eastcott .............................. 327/336 |
| 4,568,913 | 2/1986 | Evans ................................. 341/167 |
| 4,617,550 | 10/1986 | Glincman ........................... 341/167 |
| 4,906,996 | 3/1990 | George ............................... 341/167 |
| 5,194,868 | 3/1993 | Bahng et al. ....................... 341/167 |

*Primary Examiner*—Timothy P. Callahan
*Assistant Examiner*—Eunja Shin
*Attorney, Agent, or Firm*—Skjerven, Morrill, MacPherson, Franklin & Friel; David E. Steuber; Paul J. Winters

[57] ABSTRACT

An integrating circuit includes first and second amplifiers for use during a zero-integrate mode and a X10 mode, respectively. The first amplifier is a low gain amplifier to ensure stability, whereas the second amplifier is a high gain amplifier to improve accuracy. During the zero-integrate mode, switches couple an integrator input lead to the first amplifier output lead and decouple it from the second amplifier output lead. During the X10 mode, the switches decouple the integrator input lead from the first amplifier output lead and couple it to the second amplifier output lead.

20 Claims, 4 Drawing Sheets

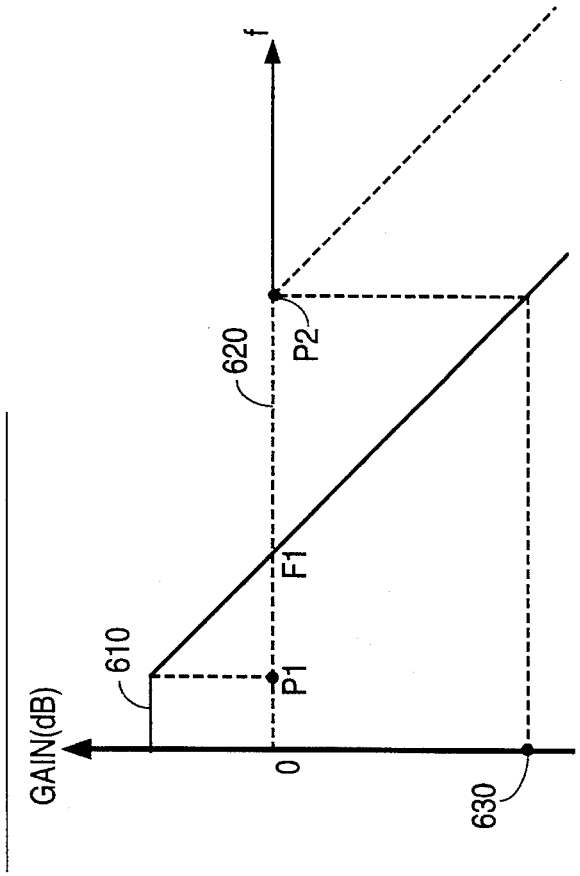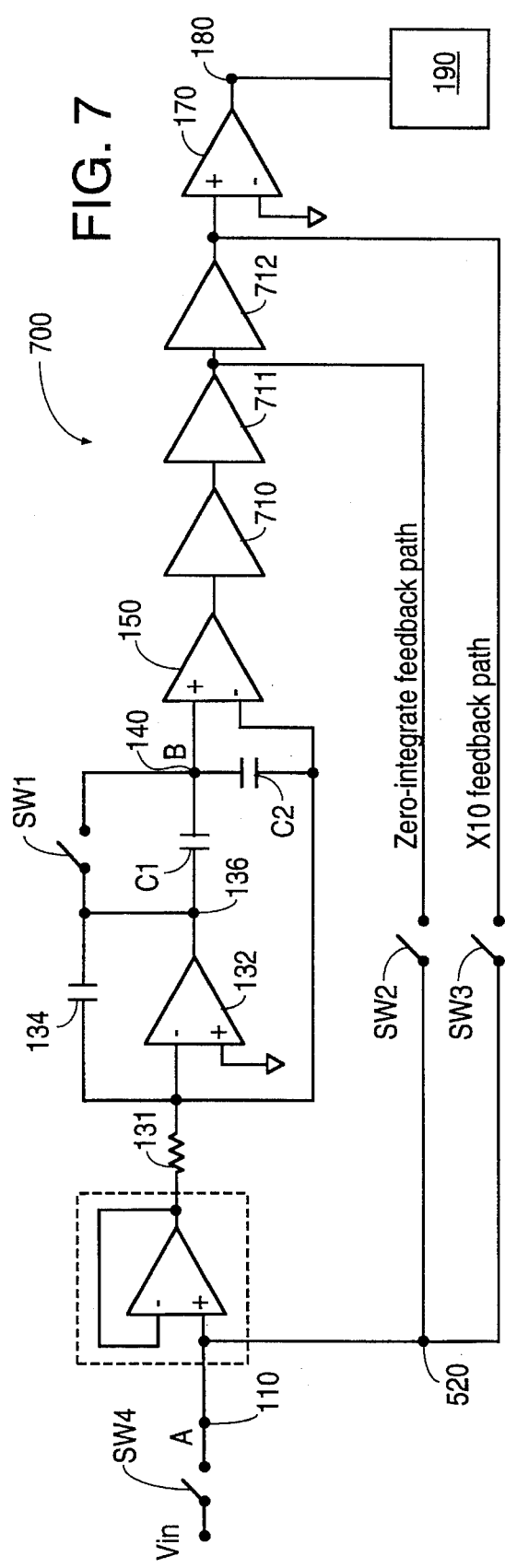

INTEGRATOR SYSTEM WITH VARIABLE GAIN FEEDBACK

FIELD OF THE INVENTION

This invention relates to integrating circuits and, more particularly, to integrating circuits with variable gain feedback.

BACKGROUND INFORMATION

FIG. 1 shows a schematic diagram of an integrating circuit commonly used in a dual slope integrating analog-digital converter having at least the following four modes of operation: integrate, deintegrate, zero-integrate, and X10 modes.

During the integrate mode, an analog input voltage Vin is applied to an input terminal 110 for a fixed period of time. A timing and control circuit 115 closes switch SW1 and opens switch SW2. In this example, Vin is equal to $V_1$, which is a positive voltage. A buffer circuit 120 receives input voltage Vin and outputs a voltage Vbuf at a node 122, which is substantially equal to voltage $V_1$. An integrator circuit 130 receives voltage Vbuf and generates a voltage $V_{INT}$ at a node 136 and, consequently, a voltage $V_B$ at a node B, according to the equation:

$$V_{INT}(t) = -1/(Rint*Cint) \int_0^t Vbuf(\tau)d\tau + Vin(0)$$

where Rint is the value of a resistor 131, Cint is the value of feedback capacitor 134 in parallel with capacitor C2, and Vin(0) is the initial voltage across feedback capacitor 134 and capacitor C2. The effect of capacitor C1 is negligible because switch SW1 "shorts out" capacitor C1.

FIG. 2 shows a diagram of the voltage output of the integrator in the integrating circuit of FIG. 1 during the integrate and deintegrate modes. Curve 210 represents the voltage Vbuf supplied to the input of integrator circuit 130. During time period T1 (integrate mode), voltage Vbuf is substantially equal to $V_1$ as shown by segment 211 of curve 210. Curve 220 represents the voltage $V_{INT}$ in response to voltage Vbuf. Because voltage Vbuf is constant during time period T1, voltage $V_{INT}$ is linear as shown by segment 221 of curve 220.

Referring back to FIG. 1, during the deintegrate mode, timing and control circuit 115 controls switch SW1 to remain closed and switch SW2 to remain opened. The value of voltage Vin applied to input terminal 110 is forced to be equal to $-V_{ref}$, which is of opposite polarity from voltage $V_1$. The voltage $-V_{ref}$ is obtained by charging a reference capacitor (not shown) with voltage $V_{ref}$ supplied by a voltage reference (not shown) and then coupling the reference capacitor's negative electrode to input terminal 110 and coupling the reference capacitor's positive electrode to the source of ground potential. As a result, capacitors C2 and 134 begin to discharge and voltage $V_B$ increases at a predetermined fixed slope as shown by segment 222 of curve 220 (FIG. 2).

Also at the beginning of the deintegrate mode, timing and control circuit 115 in a digital section 190 generates clock pulses received by a counter 194. Amplifier 150 receives voltage $V_B$ at a positive input lead 152 and compares it to the voltage at a negative input lead 154. The voltage at negative input lead 154 is substantially equal to ground potential because negative input lead 154 is coupled to the negative input lead of amplifier 132, which is a "virtual ground" due to the operation of integrating circuit 130. When voltage $V_B$ is lower than ground potential, amplifier 150 generates a negative voltage output signal at a node 160, which is coupled to the positive input lead of comparator 170. Comparator 170 generates a logic "zero" signal as voltage Vout at output node 180, which is coupled to digital section 190. Comparator 170 continues to generate a logic "zero" until voltage $V_B$ becomes positive, and then outputs a logic "one". In response to this logic "one" signal, timing and control circuit 115 stops counter 194 and causes voltage Vin to equal 0 V. Thus, counter 194 counts the number of clock pulses needed to completely discharge feedback capacitor 134 (i.e., the time needed for the signal generated at output terminal 180 to reach to a logic "one"). The value of counter 194 is proportional to the voltage level of voltage Vin, and thus the output of counter 194 represents the value of analog voltage Vin in digital form.

The zero-integrate mode is used to completely discharge feedback capacitor 134 after an input signal overrange during the deintegrate mode (i.e., counter 194 has reached its maximum value before the end of the deintegrate mode). During the zero-integrate mode, timing and control circuit 115 controls switches SW1 and SW2 to be closed, which causes integrator 130 to be cascaded with an RC filter formed by the "on" resistance Ron of switch SW1 and capacitor C2. As stated above, the effect of capacitor C1 is negligible because switch SW1 "shorts out" capacitor C1.

On the occurrence of a positive input overrange, voltage $V_B$ at node B is negative. As a result, during the zero-integrate mode, amplifier 150 generates a negative output voltage at a node 160. Buffer 120 receives this negative voltage via switch SW2, which causes integrator 130 to ramp up the voltage at node B, thereby decreasing the absolute value of voltage $V_B$. When voltage $V_B$ reaches ground potential, the output voltage of amplifier 150 is substantially 0 V and feedback capacitor 134 is fully discharged.

The X10 mode is used to multiply the residual charge of capacitor C2 by −10 to achieve greater resolution in the digital output of the A/D converter. During the X10 mode, timing and control circuit 115 opens switch SW1 and closes switch SW2. FIG. 3 shows a timing diagram of the output of the integrator in the integrating circuit of FIG. 1, wherein curve 305 represents the clock pulses generated by timing and control circuit 115. As stated above, the deintegrate mode ends when voltage $V_B$ is substantially equal to 0 V and timing and control circuit 115 causes voltage Vin to be 0 V to end the deintegrate mode.

However, voltage $V_B$ will typically reach 0 V at some point within a clock period of the timing and control circuit's clock signal 305. In this example, the voltage VB reaches 0 V at a point 301 in a clock period 311. As a result, integrator circuit 130 will continue to deintegrate until the end of clock period 311. Consequently, voltage $V_B$ will rise above 0 V, resulting in a positive residual voltage Vres across capacitors 134 and C2.

The value of counter 194 up to clock period 311 is used to display the value of voltage Vin. However, the counter's value will result in larger value than the true value of voltage Vin. The residual voltage Vres is used in the X10 mode to gain more resolution as follows.

Capacitors C1 and C2 are designed so that the capacitance C2* of capacitor C2 is ten times greater than the capacitance C1* of capacitor C1.

$$C2* = 10 \; C1* \tag{1}$$

During the X10 mode, timing and control circuit 115 opens switch SW1 and closes switch SW2. Amplifier 150 senses the residual voltage across capacitor C2 and feeds back a positive voltage to the input of integrator 130 via switch SW2 and buffer 120. As a result, integrator 130 begins to decrease the voltage at node 136, which in turn begins to reduce voltage $V_B$ (i.e., the residual voltage across capacitor C2). Because of the negative loop from the output of amplifier 150 to the input of integrator 130, integrator 130 will continue to decrease the voltage at node 136 until voltage $V_B$ is equal to substantially 0 V. The voltage at node 136 is determined as follows.

At the end of the deintegrate mode (i.e., the start of the X10 mode), the charge stored by capacitor C2 is:

$$Q(0) = C2 * V_{res} \quad (2)$$

where Q(0) is the residual charge initially stored by capacitor C2 at the start of the X10 mode.

Because capacitors C1 and C2 are connected in series and the voltage across capacitor C1 is zero, charge Q(0) is transferred to capacitor C2 to force voltage $V_B$ to be 0 V. Thus, when voltage $V_B$ reaches 0 V, capacitor C1 stores charge substantially equal to negative Q(0). At this point, the voltage across capacitor C1 is:

$$V_{C1} = \frac{-Q(0)}{C1*} \quad (3)$$

where $V_{C1}$ is the voltage across capacitor C1.

Combining equations (1), (2), and (3) when voltage $V_B$ is substantially equal to 0 V results in $$V_{C1} = -10 \; V_{res} \quad (4)$$

Consequently, because voltage $V_{C2}$ is substantially equal to 0 V, the voltage across capacitor 134 is also negative 10 Vres. Then integrating circuit 100 enters a second deintegrate mode, where timing and control circuit 115 closes switch SW1 and opens switch SW2. As a result, with capacitor C1 "shorted out", charge from capacitors C1 and 134 redistribute between capacitors C2 and 134 until the voltage across capacitor C2 is equal to the voltage across capacitor 134. Capacitor 134 is designed to be much larger than capacitor C2 so that very little charge is redistributed to make the capacitor voltages equal. Thus, at the start of the second deintegrate cycle, voltage $V_B$ remains approximately equal to −10 Vres.

At the end of the second deintegrate cycle, the value of counter 194 represents approximately negative ten times the residual voltage. This value is then divided by −10 and the result added to the first deintegrate value to determine a more accurate value for voltage Vin.

Further, a second residual voltage results from the second deintegrate mode. A second X10 mode, followed by a third deintegrate mode, may be repeated to determine a still more accurate value for voltage Vin. At the end of the third deintegrate mode, the value of counter 194 represents approximately 100 times the residual voltage (i.e., −10 * −10) the second residual voltage. This value is then divided by 100 and the result added to the result from the previous X10/deintegrate cycle to determine a more accurate value for voltage Vin.

FIG. 4 shows a series of two X10 mode/deintegrate modes following an integrate mode/deintegrate mode. In this example, the A/D converter is designed to have a 0.4 V full scale with a 4000 count reading. Thus, each clock period represents a hundredth of a volt. Consequently, when voltage Vin is equal to 0.1234 V, at the end of the first deintegrate mode represented by curve 410, counter 194 will have a value of 13 (which represents 0.13 V), with Vres approximately equal to 0.0066 V. At the end of the first X10 mode represented by curve 415, voltage $V_B$ is approximately equal to 0.066 V. Consequently, at the end of the second deintegrate cycle represented by curve 420, the value of counter 194 is 7 (which represents 0.07 V) with a Vres approximately equal to 0.004 V. Following the second X10 mode represented by curve 425, voltage $V_B$ is approximately equal to 0.04 V. As a result, after the third deintegrate cycle represented by curve 430, the value of counter 194 is 4.

The value of voltage Vin is calculated by dividing the first X10 mode value by "−10" and the second X10 mode value by "100" to account for the added gain during the X10 mode(s), and then adding the result to the first deintegrate mode value. For this example, the result is:

$$Vin = 0.13 \; V + 0.07 * (1/-10) + 0.04 * (1/-10)(1/-10) \; Vin = 0.13 \; V - 0.007 \; V + 0.0004 \; V \; Vin = 0.1234$$

In this example, capacitor C2 was designed to be ten times capacitor C1 so that a decimal value of voltage Vin is easily computed as shown above. If the value of voltage Vin is desired in a different base, a different ratio between capacitors C1 and C2 can be used. For example, if it is desired to calculate the value of voltage Vin in octal (base 8), then capacitor C1 can be designed to be eight times the value of capacitor C2.

When input voltage Vin is negative, integrating circuit 100 operates in a similar manner as described above for a positive voltage Vin, except that all the polarities are reversed. The operation of integrating circuit 100 receiving a negative Vin is seen by "flipping" each of FIGS. 2–4 about the horizontal time axis. Thus, during the deintegrate mode, a positive voltage $V_{ref}$ is applied to input terminal 110 so that voltage $V_B$ is ramped down and counter 194 measures the time for voltage $V_B$ to reach 0 V. During the X10 mode, a negative Vres results, which is multiplied by "−10" to generate a positive $V_B$, which is deintegrated to determine negative ten times the residual voltage. The X10 mode is repeated to determine the "residual of the residual" for a more accurate measurement.

For this circuit to be stable, the gain of amplifier 150 must be limited such that the total loop gain is 0 dB or less where the phase shift introduced at node B is equal to −180° (discussed below in conjunction with FIG. 6). Thus, defining $Gamp_{150}$ as the gain of amplifier 150 and Gba as the gain from input terminal 110 to the positive input of amplifier 150, then as a condition for stability during zero-integrate mode, we must have:

$$Gamp_{150} + Gba < 0 \; dB$$

Because Gba is negative and $Gamp_{150}$ is positive, this equation becomes:

$$Gamp_{150} < |Gba| \quad (5)$$

where |Gba| is the absolute value of gain Gba.

This leads to a dilemma. It is desirable to improve the performance of integrating circuit 100 by decreasing the time that integrating circuit 100 requires to perform the X10 mode. One solution to increase performance has been to increase the gain in amplifier 150 to more quickly charge capacitors 134 and C1 to negative ten times the voltage Vres. However, for stability in the zero-integrate mode, the gain of amplifier 150 is limited according to equation (5). Therefore a circuit which allows a designer to use a high gain amplifier in the X10 mode without the danger of oscillation will be highly useful.

SUMMARY

According to one embodiment of the present invention, an integrating circuit includes first and second amplifiers for use in a zero-integrate mode and a X10 mode, respectively. The first amplifier is a relatively low gain amplifier and the second amplifier is a relatively high gain amplifier.

During the zero-integrate mode, switches couple the input lead of an integrator to the output lead of the first amplifier and decouple it from the output lead of the second amplifier. Thus, the low gain first amplifier operates during the zero-integrate mode, which ensures stability of the integrating circuit.

During the X10 mode, the switches decouple the input lead of the integrator from the output lead of the first amplifier and couple it to the output lead of the second amplifier. Thus, the high gain second amplifier operates during the X10 mode, which improves the accuracy and speed of the integrating circuit.

BRIEF DESCRIPTION OF THE DRAWINGS

FIG. 6 shows a graph of the frequency response of the integrating circuit of FIG. 5 during the zero-integrate mode.

FIG. 7 shows a schematic diagram of another embodiment of the present invention.

DETAILED DESCRIPTION

Figure 1:
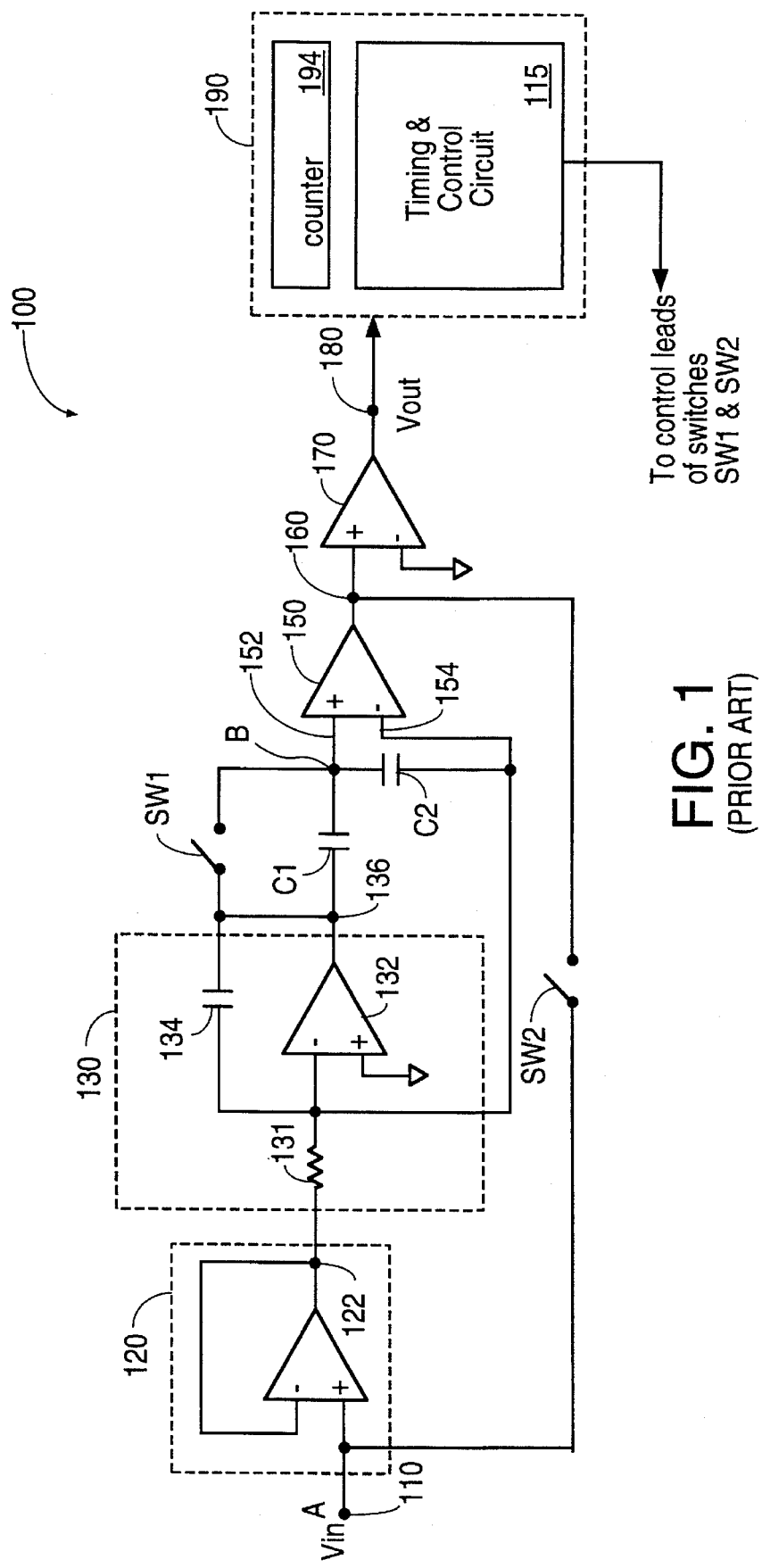
FIG. 1 shows a schematic diagram of an integrating circuit commonly used in an integrating analog-digital converter.
Figure 2:
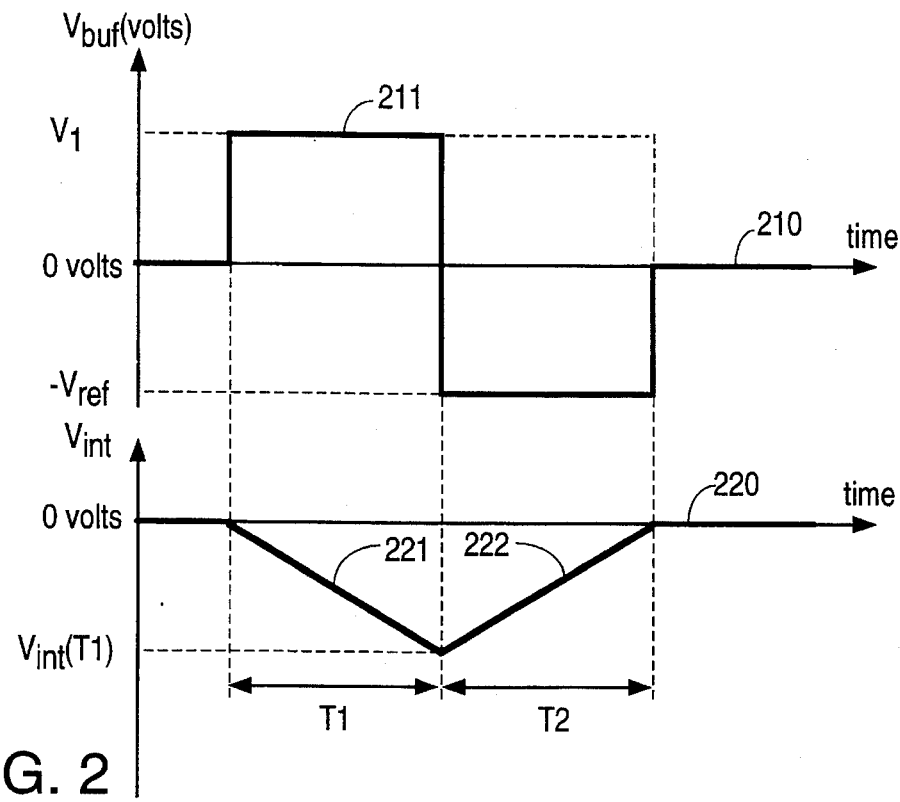
FIG. 2 shows a diagram of the voltage output of the integrator in the integrating circuit of FIG. 1.
Figure 3:
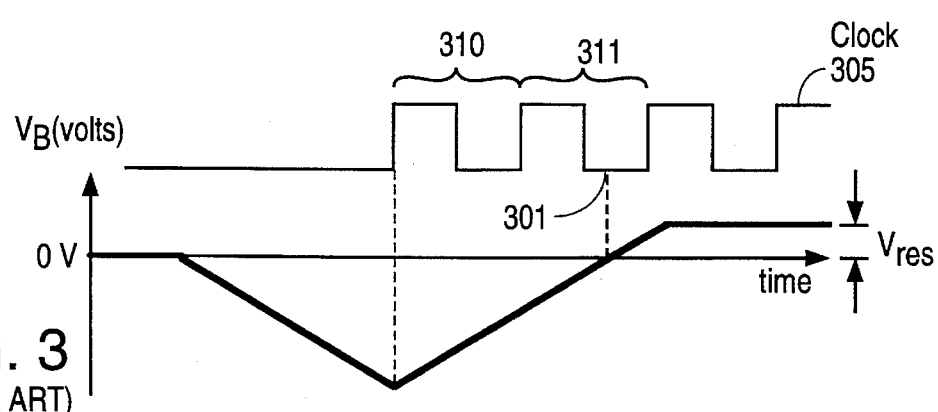
FIG. 3 shows a timing diagram of the output of the integrator in the integrating circuit of FIG. 1.
Figure 4:
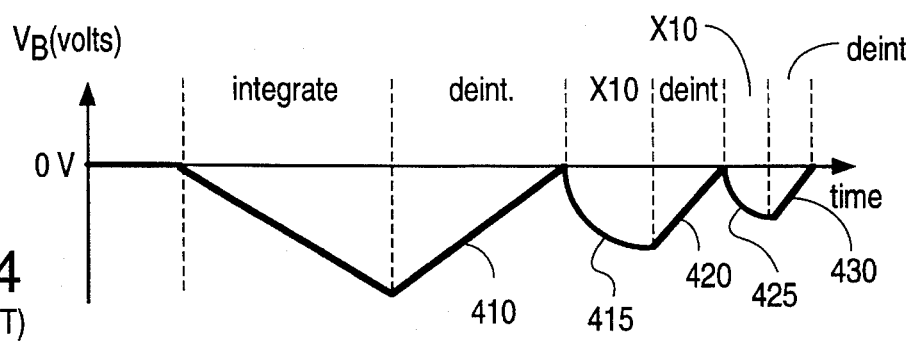
FIG. 4 shows a series of the two X10 mode/deintegrate mode cycles following an integrate mode/deintegrate mode cycle.
Figure 5:
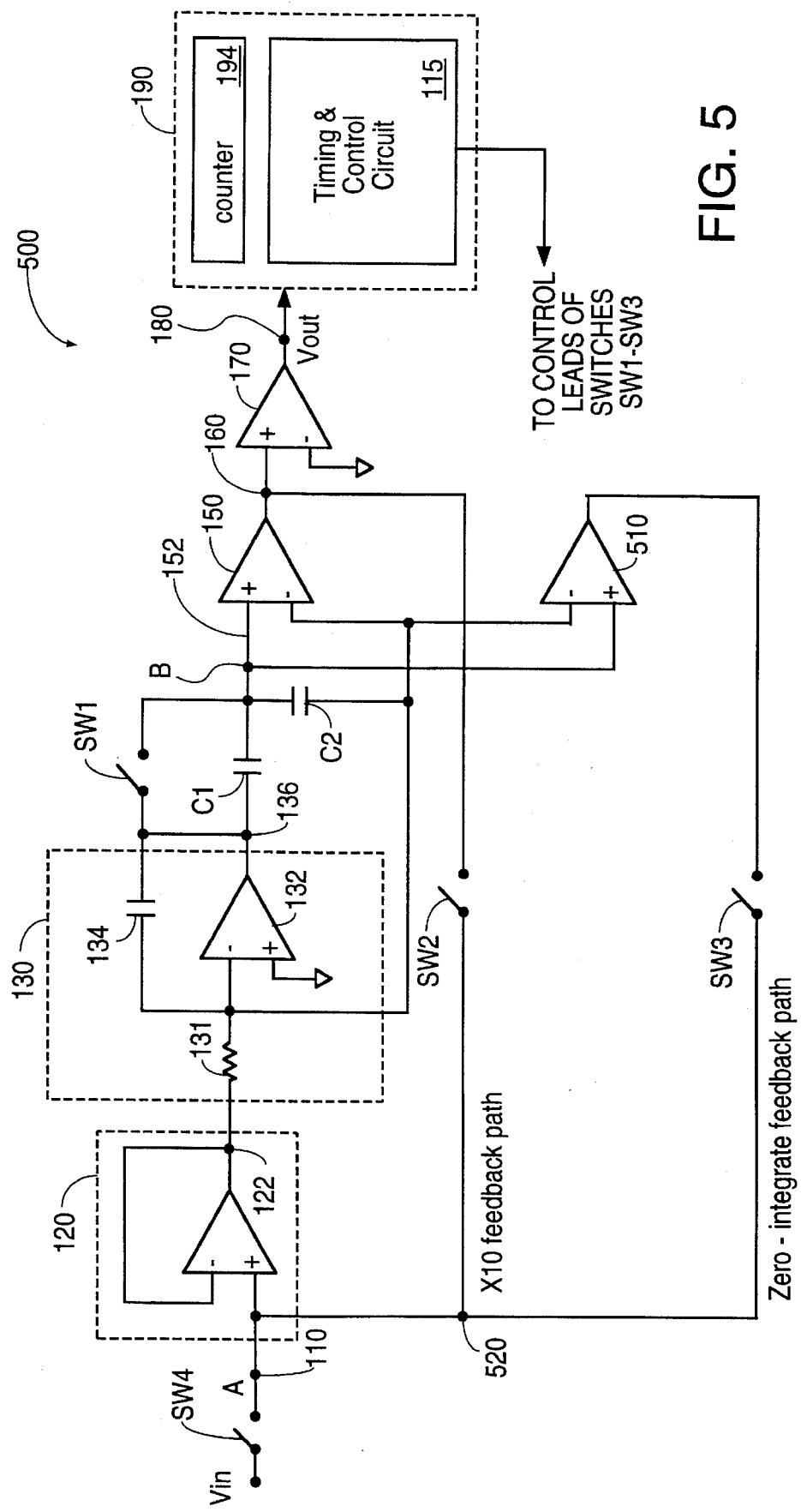
FIG. 5 shows a schematic diagram of one embodiment of the present invention.

FIG. 5 shows a schematic diagram of one embodiment of the present invention. Integrating circuit 500 is similar to integrating circuit 100 (FIG. 1) but includes a third amplifier 510 and switches SW3 and SW4. Amplifier 150 has a gain that is greater than the gain of amplifier 510. For clarity, the same reference numbers are used between figures for elements having the same general function and interconnection.

During the integrate mode, timing and control circuit 115 closes switch SW4 to apply an input voltage Vin input terminal 110 for a fixed period of time. Timing and control circuit 115 also closes switch SW1 and opens switches SW2 and SW3. Because switch SW3 is opened, the output lead of an amplifier 510 is "open circuited" and there is no feedback from node 160 to the input of integrator 130. Consequently, amplifier 510 does not influence the operation of integrating circuit 500, and, thus, integrating circuit 500 operates similarly to integrating circuit 100 (FIG. 1) in integrate mode.

During the deintegrate mode, timing and control circuit 115 controls switches SW1 and SW4 to remain closed and switches SW2 and SW3 to remain opened. Timing and control circuit 115 also causes voltage $-V_{ref}$ to be applied to input terminal 110. Because switch SW3 remains open, the output of amplifier 510 is "open circuited", and consequently, amplifier 510 does not influence the operation of integrating circuit 500. Thus, integrating circuit 500 operates similarly to integrating circuit 100 in deintegrate mode.

During the zero-integrate mode, timing and control circuit 115 controls switch SW1 to remain closed, switches SW2 and SW4 open and switch SW3 to be closed. Because switch SW4 is opened, the input voltage is disconnected from input terminal 110 and, thus, voltage Vin does not affect the operation of the integrating circuit 500 in the zero-integrate mode. Integrating circuit 500 operates similarly to integrating circuit 100 in zero-integrate mode.

During the X10 mode, timing and control circuit 115 controls switches SW1 SW3 and SW4 to be opened and switch SW2 to be closed. Because switch SW3 is opened and switch SW2 is closed, the output lead of amplifier 150 is coupled to a node 520. Because switch SW4 is opened, the input voltage is disconnected from input teminal 110 and, thus, does not affect the operation of integrating circuit 500 in the X10 mode. As a result, integrating circuit 500 operates similarly to integrating circuit 100.

The Nyquist criterion for stability requires that the system's open-loop gain be less than or equal to unity at any frequency where the system's phase response is equal to $-180°$. During the zero-integrate mode, the open loop gain of integrating circuit 500 is equal to the sum of the gains Gba, $Gamp_{510}$, and the gain of buffer 120. The gain of buffer 120 is 0 dB and, therefore, the sum of gains Gba and $Gamp_{510}$ must be less than 0 dB when the frequency response is $-180°$. Gains Gba and $Gamp_{510}$ are determined as follows.

Because integrator 130 and the RC filter (formed by the "on" resistance Ron of switch SW1 and capacitor C2) are cascaded, their respective gains (in dB) are added to determine gain Gba. FIG. 6 shows a graph of the frequency response of the integrating circuit of FIG. 5 during the zero-integrate mode. Curve 610 is the frequency response of integrator 130, and curve 620 is the frequency response of the RC filter. Integrator 130 has approximately unity gain (i.e., 0 dB) at the frequency F1 given by $1/[(Rint)(Cint)]$. Thus, assuming a constant gain-bandwidth product over the frequency range of interest, the gain-bandwidth product is equal to F1. Defining Ao as the open loop low frequency gain of the amplifier 132, then the pole P1 of integrator 130 is given by:

$$P1 * Ao=1/[(Rint)\ (Cint)] \text{ or}$$

$$P1=1/[Ao(Rint)\ (Cint)] \quad (6)$$

Because pole P1 is a first order pole, pole P1 introduces an approximately $-45°$ phase shift when the input signal's frequency is equal to pole P1. The phase shift approaches $-90°$ as the input frequency increases.

Further, the RC filter has a gain of 0 dB and it introduces a pole P2 given by:

$$P2=1/[(Ron)\ (C2)] \quad (7)$$

Pole P2 is also a first order pole and introduces another $-45°$ of phase shift when the input signal's frequency is equal to pole P2. Consequently, when the input signal's frequency is equal to pole P2, a total of $-135°$ of phase shift is introduced. The phase shift approaches $-180°$ as the input signal's frequency increases beyond pole P2. Thus, for frequencies greater than P2, integrating circuit 500 risks instability.

Combining equations (6) and (7) gives, gain Gba (the gain from input terminal 110 to node B) as:

$$Gba(f)=Ao/[(1+jf/P1)\ (1+jf/P2)] \quad (8)$$

where f is the frequency. Gain Gba is negative as indicated by point 630.

Amplifier 510 also has a pole but this is much larger than P2 and, thus, has a negligible impact on the frequency response at the vicinity of P2. However, to satisfy the Nyquist criterion with a 45° phase margin at a frequency equal to pole P2, the gain of amplifier 510 must be less than the magnitude of gain Gba indicated by point 630. At frequencies greater than pole P2, the magnitude of gain Gba increases. Assuming amplifier 510 has a constant gain in the frequency of interest, this causes the open-loop gain to be less than 1, thereby ensuring stability.

During the X10 mode, switches SW1 and SW3 are opened while SW2 is closed. The frequency response of integrator 130 is still the same as curve 610 shown in FIG. 6. However, the combination of C2 and C1 forms a divider that does not introduce any phase shift. Because the pole of amplifier 150 occurs at a much higher frequency than the pole of integrator 130, the frequency response of integrator 130 dominates. Thus, the total phase shift during the X10 mode is only −90° and, consequently, the loop is always stable for the frequency range of interest. Therefore, the gain of amplifier 150 is not limited by equation (5) and amplifier 150 may have a much greater gain than amplifier 510 to more quickly charge capacitor C1 to ten times the residual voltage across capacitor C2. Accordingly, the performance of integrating circuit 500 is improved by designing amplifier 150 to have a high gain.

In contrast, integrating circuit 100 (FIG. 1) uses amplifier 150 for both zero-integrate and X10 modes. Thus, the performance of integrating circuit 100 is limited by the gain of amplifier 150 and cannot be improved without risking instability. Integrating circuit 500 avoids the shortcomings of integrating circuit 100 by using different amplifiers in the X10 and zero-integrate modes.

In another embodiment, buffer 120 is replaced by the buffer disclosed in the contemporaneously filed application Ser. No. [Attorney Docket No. M-2978] "SWITCHED HIGH SLEW RATE BUFFER" by Zhong Heng Mo, which is incorporated herein by reference.

FIG. 7 shows a schematic diagram of another embodiment of the present invention. Integrating circuit 700 is similar to integrating circuit 500 (FIG. 5), but without amplifier 510. Instead, the output of amplifier 150 is cascaded with low-gain-high bandwidth amplifiers 710–712. Switches SW1–SW4 operate as in integrating circuit 500, and thus, during the zero-integrate mode, the output of amplifier 711 is fed back to node 520. The gains of amplifiers 150, 710, and 711 are designed so that the sum of their magnitudes is less than the magnitude of gain Gba to satisfy the Nyquist criterion. Amplifier 712 provides additional gain for the X10 mode.

It is appreciated that additional amplifiers may be inserted between amplifiers 150 and 170, or amplifiers 710 and 711 may be deleted, to adjust the gain in the feedback paths, so long as the total gain of the amplifiers in the zero-integrate feedback path is less than the magnitude of gain Gba.

The foregoing has described the principles and preferred embodiments of the present invention. However, the invention should not be construed as being limited to the particular embodiments described. For example, different implementations of integrator 130 and buffer 120 may be used. Also, switches SW1–SW3 may be implemented using bipolar transistors rather than field effect transistors. Thus, the above-described embodiments should be regarded as illustrative rather than restrictive. Variations can be made to those embodiments by workers skilled in the art without departing from the scope of the present invention as defined by the following claims.

I claim:

1. An integrating circuit, comprising:
   an input terminal;
   an output terminal;
   an integrator having an integrator input lead coupled to said input terminal, and an integrator output lead;
   a first amplifier having a first input lead, a second input lead coupled to said integrator input lead, and a first amplifier output lead coupled to said output terminal;
   a second amplifier having a third input lead coupled to said first input lead, a fourth input lead coupled to said second input lead, and a second amplifier output lead and wherein said first amplifier has an open-loop gain not equal to an open-loop gain of said second amplifier;
   a first capacitor coupled between said integrator output lead and said first input lead;
   a second capacitor coupled between said first input lead and said second input lead;
   a first switch for selectably coupling said integrator output lead to said first input lead;
   a second switch for selectably coupling said first amplifier output lead to said input terminal; and
   a third switch for selectably coupling said second amplifier output lead to said input terminal.

2. The circuit recited in claim 1, further comprising a comparator coupled between said first amplifier output lead and said output terminal.

3. The circuit recited in claim 2, further comprising a buffer circuit coupled between said input terminal and said integrator input lead.

4. The circuit recited in claim 3, wherein said integrator further comprises:
   an amplifier having a fifth input lead coupled to a source of ground potential, and a sixth input lead;
   a resistor coupled between said integrator input lead and said sixth input lead; and
   a feedback capacitor coupled between said sixth input lead and said integrator output lead.

5. The circuit recited in claim 4, wherein in a X10 mode, said first switch does not couple said integrator output lead to said first input lead, said second switch couples said first amplifier output lead to said input terminal, and said third switch does not couple said second amplifier output lead to said input terminal, whereby a residual voltage across said feedback capacitor is multiplied approximately by −10.

6. The circuit recited in claim 4, wherein in a zero-integrate mode, said first switch couples said integrator output lead to said first input lead, said second switch does not couple said first amplifier output lead to said input terminal, said third switch couples said second amplifier output lead to said input terminal, and a fourth switch does not couple an input voltage to said input terminal whereby said feedback capacitor is completely discharged.

7. A method for improving the performance of an integrating circuit including an integrator, first and second amplifiers, said first amplifier having an open-loop gain more than said second amplifier, said integrating circuit operating in a zero-integrate mode and a X10 mode, said method comprising the steps of:
   coupling a first output lead of said first amplifier to an integrator input lead of said integrator and decoupling a second output lead of said second amplifier from said integrator input lead during said X10 mode; and coupling said second output lead to said integrator input lead and decoupling said first output lead from said integrator input lead during said zero-integrate mode.

8. An integrating circuit having a zero-integrate mode and an X10 mode, said circuit comprising:

an integrator having an integrator input lead and an integrator output lead;

a first amplifier having a first input lead, a second input lead coupled to said integrator input lead, and a first amplifier output lead;

a second amplifier having a third input lead coupled to said first input lead, a fourth input lead coupled to said second input lead, and a second amplifier output lead, and wherein said first amplifier has an open-loop gain not equal to an open-loop gain of said second amplifier;

first switch means for coupling said first amplifier output lead to said integrator input lead and decoupling said first amplifier output lead from said integrator input lead during said zero-integrate mode; and second switch means for coupling said second amplifier output lead to said integrator input lead and decoupling said second amplifier output lead from said integrator input lead during said X10 mode.

9. The circuit recited in claim 8, further comprising a comparator having a fifth input lead coupled to said first amplifier output lead and an sixth input lead coupled to a source of ground potential.

10. The circuit recited in claim 8, further comprising a buffer coupled between said first switch means and said integrator input lead.

11. The circuit recited in claim 10, wherein said buffer is coupled between said second switch means and said integrator input lead.

12. An integrating circuit, comprising:

an input terminal;

an output terminal;

an integrator having an integrator input lead coupled to said input terminal, and an integrator output lead;

a first amplifier having a first input lead, a second input lead coupled to said integrator input lead, and a first amplifier output lead;

a second amplifier having an input lead coupled to said first amplifier output lead, and an output lead coupled to said output terminal;

a first capacitor coupled between said integrator output lead and said first input lead;

a second capacitor coupled between said first input lead and said second input lead;

a first switch for selectably coupling said integrator output lead to said first input lead;

a second switch for selectably coupling said first amplifier output lead to said input terminal; and a third switch for selectably coupling said second amplifier output lead to said input terminal.

13. The circuit recited in claim 12, further comprising a comparator coupled between said second amplifier output terminal and said output terminal.

14. The circuit recited in claim 13, further comprising a buffer circuit coupled between said input terminal and said integrator input lead.

15. The circuit recited in claim 14, further comprising at least one amplifier coupled between said first amplifier and said second amplifier.

16. The circuit recited in claim 15, further comprising at least one amplifier coupled between said second amplifier and said output terminal.

17. The circuit recited in claim 14, wherein in a zero-integrate mode, said first switch couples said integrator output lead to said first input lead, said second switch couples said first amplifier output lead to said input terminal, and said third switch does not couple said second amplifier output lead to said input terminal, whereby said feedback capacitor is completely discharged.

18. The circuit recited in claim 14, wherein in a X10 mode, said first switch does not couple said integrator output lead to said first input lead, said second switch does not couple said first amplifier output lead to said input terminal, and said third switch couples said second amplifier output lead to said input terminal, whereby a residual voltage across said feedback capacitor is multiplied approximately by −10.

19. The circuit recited in claim 1, wherein said first amplifier has a higher open-loop gain than said second amplifier.

20. The circuit recited in claim 8, wherein said first amplifier has a higher open-loop gain than said second amplifier.

* * * * *